(12) United States Patent
Iwata

(10) Patent No.: US 12,148,772 B2
(45) Date of Patent: Nov. 19, 2024

(54) LIGHT DETECTION DEVICE INCLUDING AN AVALANCHE DIODE

(71) Applicant: CANON KABUSHIKI KAISHA, Tokyo (JP)

(72) Inventor: Junji Iwata, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/680,055

(22) Filed: Feb. 24, 2022

(65) Prior Publication Data
US 2022/0181362 A1 Jun. 9, 2022

Related U.S. Application Data

(63) Continuation of application No. 16/570,826, filed on Sep. 13, 2019, now Pat. No. 11,289,520.

(30) Foreign Application Priority Data

Sep. 28, 2018 (JP) .................................. 2018-185429

(51) Int. Cl.
*H01L 27/146* (2006.01)
*G01S 17/08* (2006.01)
(Continued)

(52) U.S. Cl.
CPC .......... *H01L 27/1461* (2013.01); *G01S 17/08* (2013.01); *G01T 1/2018* (2013.01);
(Continued)

(58) Field of Classification Search
CPC ......... G06T 7/55; G01S 17/08; G01T 1/2018; H01L 29/861; H01L 27/1461;
(Continued)

(56) References Cited

U.S. PATENT DOCUMENTS 10,497,822 B2 * 12/2019 Morimoto ......... H01L 31/02027
10,971,644 B2 * 4/2021 Iwata ................ H01L 31/02027
(Continued)

FOREIGN PATENT DOCUMENTS

| CN | 105374834 A | 3/2016 | |
|---|---|---|---|
| CN | 107946326 A | 4/2018 | |
| EP | 3309847 A1 * | 4/2018 | ............ B60W 30/00 |
| JP | 2006013522 A | 1/2006 | |
| JP | 2006-179828 A | 7/2006 | |
| JP | 2015-041746 A | 3/2015 | |
| JP | 2018-64086 A | 4/2018 | |

*Primary Examiner* — Alonzo Chambliss
(74) *Attorney, Agent, or Firm* — Canon U.S.A., Inc. IP Division

(57) ABSTRACT

There are provided a light detection device and a photoelectric conversion system including the light detection device including an avalanche diode including a first semiconductor region of a first conductivity type disposed at a first depth, a second semiconductor region of a second conductivity type disposed at a second depth deeper than the first depth with respect to the first surface, a third semiconductor region that is disposed at a third depth deeper than the second depth with respect to the first surface and is in contact with the second semiconductor region, and first and second separation regions each extending from the first depth to the third depth. The second semiconductor region and the third semiconductor region each extend from the first separation region to the second separation region. The first semiconductor region, the second semiconductor region, and the third semiconductor region have portions overlapping one another in planar view.

24 Claims, 10 Drawing Sheets

(51) Int. Cl.
  *G01T 1/20* (2006.01)
  *G06T 7/55* (2017.01)
  *H01L 29/861* (2006.01)
  *H01L 31/107* (2006.01)

(52) U.S. Cl.
  CPC .......... *G06T 7/55* (2017.01); *H01L 27/14607* (2013.01); *H01L 27/1463* (2013.01); *H01L 27/14663* (2013.01); *H01L 29/8611* (2013.01); *H01L 29/8613* (2013.01); *H01L 31/107* (2013.01); *G06T 2207/30252* (2013.01)

(58) Field of Classification Search
  CPC ............... H01L 1/14663; H01L 31/107; H01L 29/8611; H01L 29/8613; H01L 29/8662; H01L 27/4663; H01L 27/14607; H01L 27/1463
  See application file for complete search history.

(56) References Cited

U.S. PATENT DOCUMENTS

| | | |
|---|---|---|
| 11,289,520 B2 * | 3/2022 | Iwata .......................... G06T 7/55 |
| 11,362,231 B2 * | 6/2022 | Sasago ................ H01L 27/1461 |
| 2009/0121306 A1 | 5/2009 | Ishikawa |
| 2010/0271108 A1 | 10/2010 | Sanfilippo |
| 2014/0339398 A1 | 11/2014 | Mazzillo |
| 2015/0054111 A1 | 2/2015 | Niclass |
| 2018/0033896 A1 | 2/2018 | Morimoto |
| 2018/0108800 A1 | 4/2018 | Morimoto |
| 2018/0204905 A1 | 7/2018 | Ohse |

\* cited by examiner

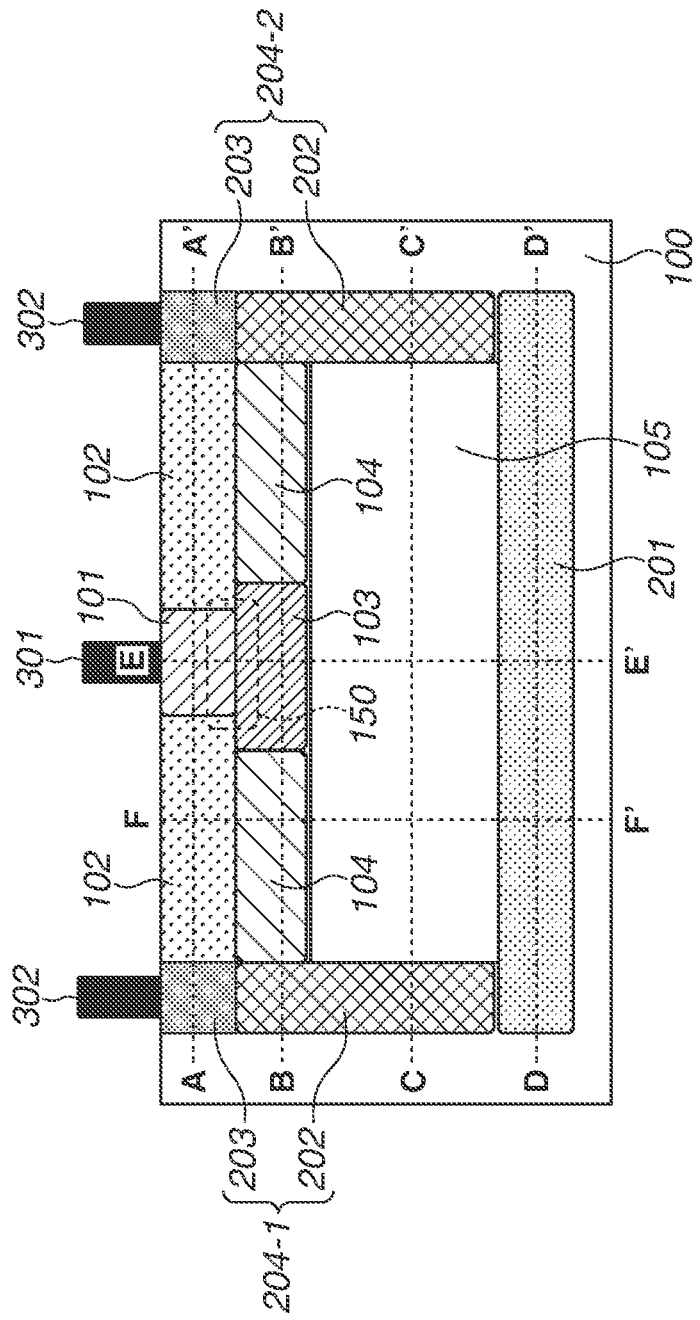

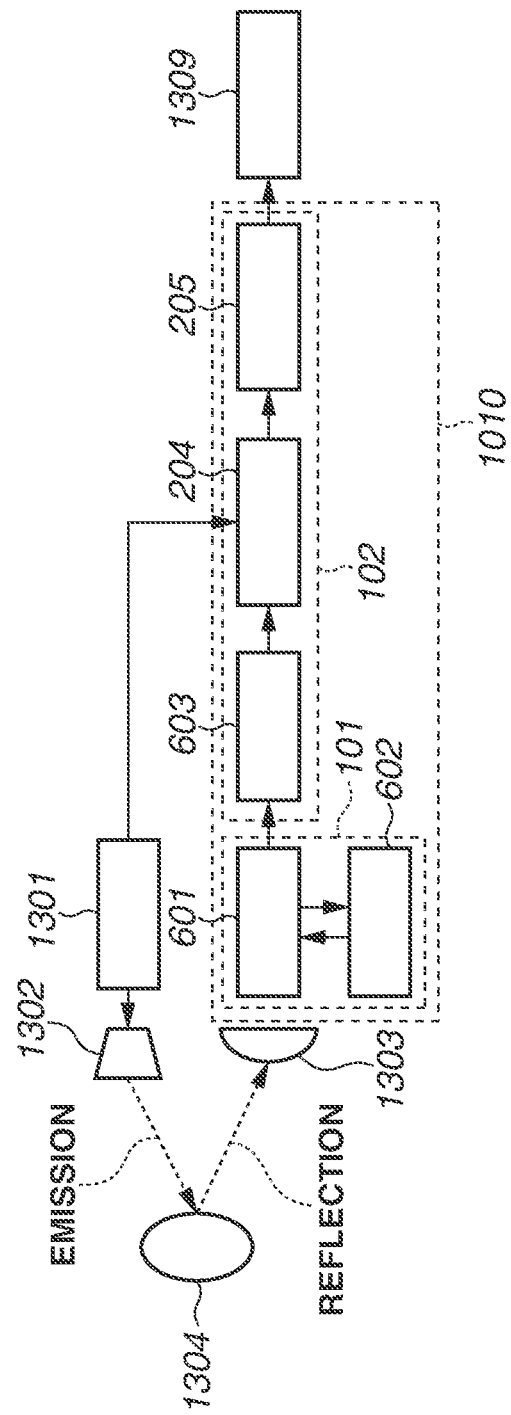

LIGHT DETECTION DEVICE INCLUDING AN AVALANCHE DIODE

CROSS-REFERENCE TO RELATED APPLICATION

This application is a Continuation of U.S. application Ser. No. 16/570,826, filed Sep. 13, 2019, which claims priority from Japanese Patent Application No. 2018-185429, filed Sep. 28, 2018, which is hereby incorporated by reference herein in its entirety.

BACKGROUND

Field

The present invention relates to a light detection device that performs photoelectric conversion, and a light detection system.

Description of the Related Art

Conventionally, there has been known a light detection device capable of detecting weak light of a single photon level using avalanche (electron avalanche) multiplication.

Japanese Patent Application Laid-Open No. 2018-64086 discloses a single photon avalanche diode (SPAD) that generates avalanche multiplication by photocharge caused by a single photon, in a PN junction region of a semiconductor region that constitutes a photoelectric conversion unit.

Further, the SPAD discussed in Japanese Patent Laid-Open No. 2018-64086 has a region having a low impurity concentration in a portion of a second semiconductor region of a second conductivity type provided below a first semiconductor region of a first conductivity type. Accordingly, a structure is provided, in which the charge generated in a third semiconductor region below the second semiconductor region is easily collected in the first semiconductor region.

SUMMARY

According to an aspect of the present disclosure, a light detection device includes a semiconductor substrate including a first surface and a second surface opposing the first surface, and a pixel region in which a plurality of pixels each including an avalanche diode is arranged on the semiconductor substrate, wherein the avalanche diode includes a first semiconductor region of a first conductivity type disposed at a first depth, a second semiconductor region of a second conductivity type disposed at a second depth deeper than the first depth with respect to the first surface, a third semiconductor region that is disposed at a third depth deeper than the second depth with respect to the first surface and is in contact with the second semiconductor region, and a first separation region and a second separation region each extending from the first depth to the third depth, wherein the second semiconductor region and the third semiconductor region each extend from the first separation region to the second separation region, and wherein the first semiconductor region, the second semiconductor region, and the third semiconductor region have portions that overlap one another in planar view.

Further features of the present disclosure will become apparent from the following description of exemplary embodiments with reference to the attached drawings.

BRIEF DESCRIPTION OF THE DRAWINGS

FIG. 3 is a cross sectional diagram of an avalanche diode.

FIG. 9 is a block diagram illustrating a configuration of the photoelectric conversion system.

DESCRIPTION OF THE EMBODIMENTS

In the structure described in Japanese Patent Laid-Open No. 2018-64086, the low impurity concentration in the region of the portion of the second semiconductor region may cause a strong local electric field between the first semiconductor region and the second semiconductor region. Noise may be generated by the strong electric field, and signal accuracy of the single photon avalanche diode (SPAD) may be reduced.

A technique described below relates to a light detection device that reduces noise while having a structure that can easily collect, in a first semiconductor region, charge generated in a third semiconductor region, and a photoelectric conversion system.

Hereinafter, a light detection device according to exemplary embodiments will be described with reference to the drawings. Note that the conductivity type of the transistor in the exemplary embodiments described below is just an example, and embodiments are not limited to the conductivity type described in the exemplary embodiments. With respect to the conductivity type described in the exemplary embodiments, the conductivity type may be changed as appropriate, and the potentials of the gate, source and drain of the transistor may be appropriately changed according to the change in the conductivity type. For example, if the transistor is operated as a switch, the low level and high level of the potential to be supplied to the gate may be reversed on the description in the exemplary embodiments.

A light detection device according to a first exemplary embodiment of the present disclosure will be described with reference to FIGS. 1 to 7F.

Figure 1:
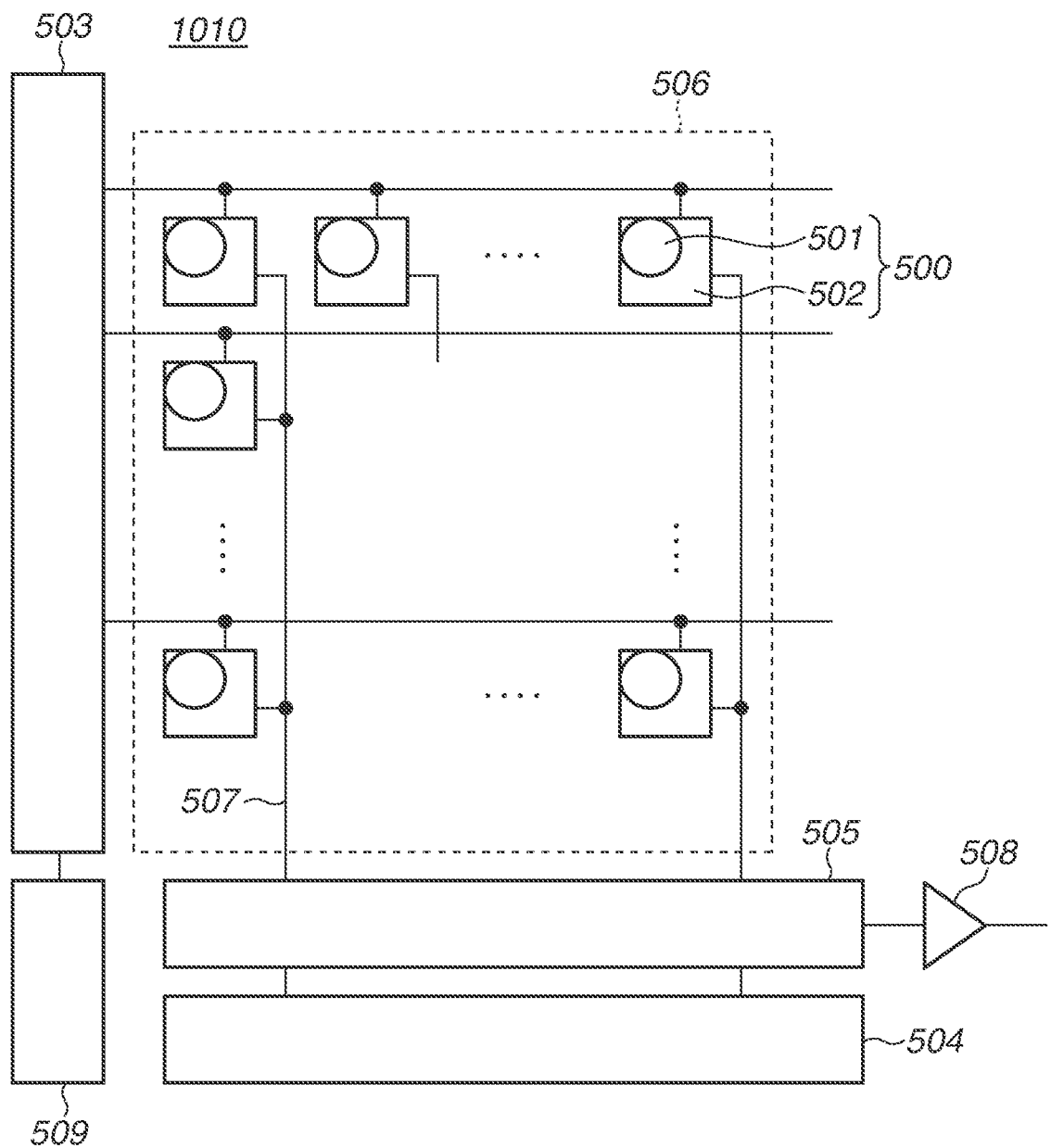
FIG. 1 is a block diagram illustrating a configuration of a light detection device.

FIG. 1 is a block diagram of a light detection device 1010 according to the present exemplary embodiment. The light detection device 1010 includes a pixel region 506, a control pulse generation unit 509, a horizontal scan circuit unit 504, a column circuit 505, a signal line 507, and a vertical scan circuit unit 503.

A plurality of pixels 500 is arranged in a matrix form in the pixel region 506. One pixel 500 includes a photoelectric conversion element 501 and a pixel signal processing unit 502. The photoelectric conversion element 501 converts light into an electrical signal. The pixel signal processing unit 502 outputs the converted electrical signal to the column circuit 505.

The vertical scan circuit unit 503 receives a control pulse supplied from the control pulse generation unit 509 and supplies the control pulse to each pixel 500. The vertical scan circuit unit 503 may include a logic circuit such as a shift register or an address decoder.

The signal line 507 supplies a signal output from the pixel 500 selected by the vertical scan circuit unit 503 to a circuit in a subsequent stage of the pixel 500 as a potential signal.

The column circuit 505 receives the signal of each pixel 500 through the signal line 507 and performs predetermined processing. The predetermined processing is processing for performing noise removal, amplification, signal correction, and the like of the input signal, and converting the signal to a form to be output to the outside of the sensor. For example, the column circuit 505 includes a parallel-serial conversion circuit.

The horizontal scan circuit unit 504 supplies to the column circuit 505 a control pulse for sequentially outputting the signal processed by the column circuit 505 to an output circuit 508.

The output circuit 508 includes a buffer amplifier, and a differential amplifier, and outputs the signal output from the column circuit 505 to a recording unit or a signal processing unit outside the light detection device 1010.

The pixels 500 in the pixel region 506 in FIG. 1 may be arranged in one dimension, or only a single pixel may be arranged. Also, the vertical scan circuit unit 503, the horizontal scan circuit unit 504, and the column circuit 505 may be arranged for each block of the pixel region 506, each block including a plurality of pixel columns. Alternatively, the vertical scan circuit unit 503, the horizontal scan circuit unit 504, and the column circuit 505 may be arranged in each pixel column.

The function of the pixel signal processing unit 502 need not necessarily be provided for each pixel 500 one by one. For example, one pixel signal processing unit 502 may be shared by a plurality of pixels 500, and signal processing may be sequentially performed. In addition, the pixel signal processing unit 502 may be provided in a semiconductor substrate different from the semiconductor substrate in which the photoelectric conversion element 501 is provided in order to increase the aperture ratio of the photoelectric conversion element 501. In this case, the photoelectric conversion element 501 and the pixel signal processing unit 502 are electrically connected to each other via connection wirings provided for each pixel. The vertical scan circuit unit 503, the horizontal scan circuit unit 504, the signal line 507, and the column circuit 505 may also be provided in a semiconductor substrate different from the semiconductor substrate in which the photoelectric conversion element 501 is provided as described above.

Figure 2:
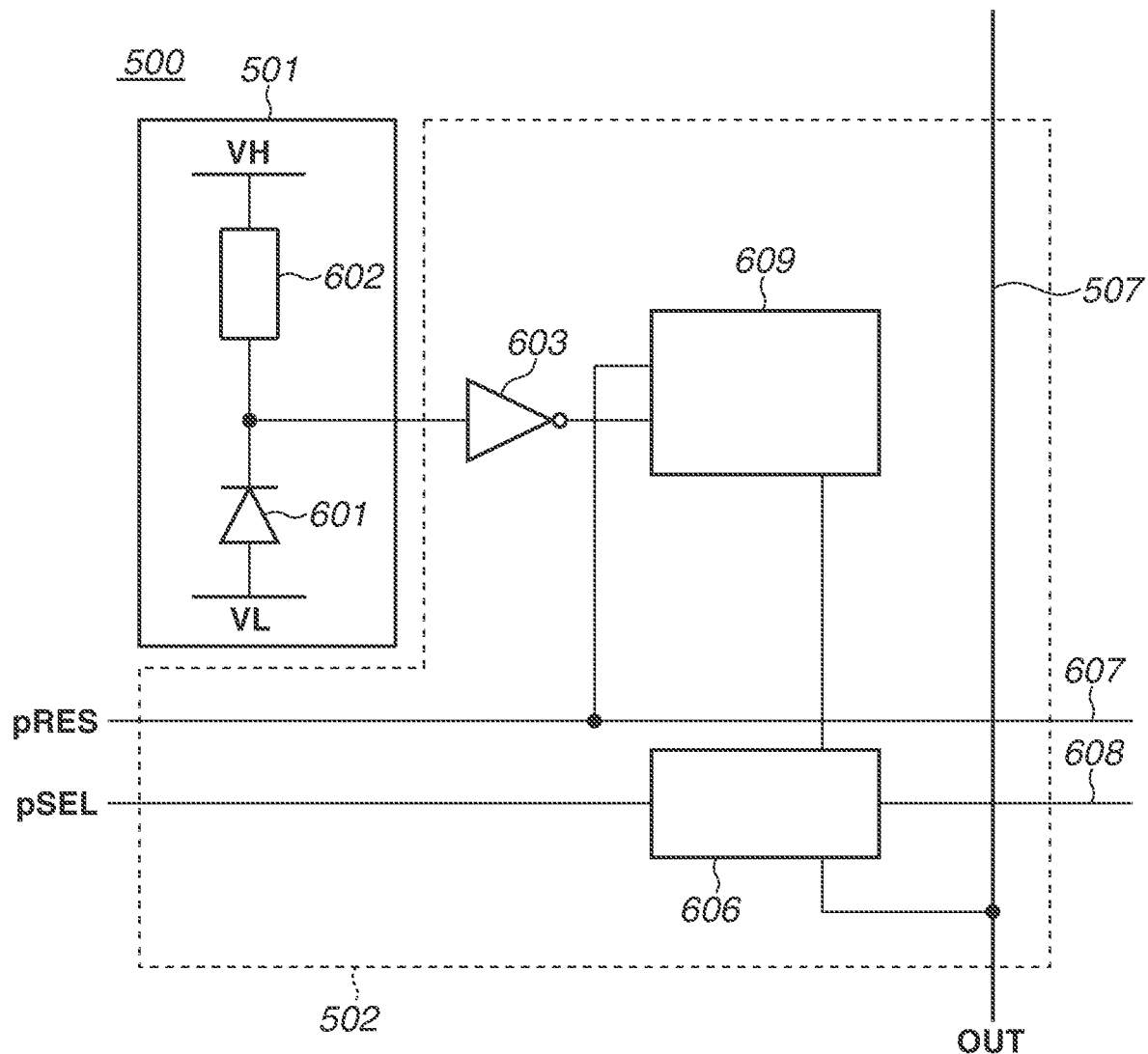
FIG. 2 is a block diagram illustrating a structure of a pixel.

FIG. 2 illustrates an example of a block diagram of the pixel 500 including an equivalent circuit according to the present exemplary embodiment. In FIG. 2, one pixel 500 has the photoelectric conversion element 501 and the pixel signal processing unit 502.

The photoelectric conversion element 501 includes a photoelectric conversion unit 601 and a quench element (control unit) 602.

The photoelectric conversion unit 601 generates charge pairs corresponding to incident light by photoelectric conversion. An avalanche diode is used as the photoelectric conversion unit 601.

A potential based on a potential VH higher than the potential VL supplied to the anode of the photoelectric conversion unit 601 is supplied to the cathode of the photoelectric conversion unit 601. Thus, the potential is supplied to the anode of the photoelectric conversion unit 601 so as to apply a reverse bias between the anode and the cathode so that the photoelectric conversion unit 601 becomes the avalanche diode. By performing photoelectric conversion in a state where the potential of the reverse bias is supplied, charge generated by incident light causes avalanche multiplication to generate an avalanche current.

In a case of supplying the potential of the reverse bias, when the potential difference between the anode and the cathode is greater than the breakdown voltage, the avalanche diode becomes in Geiger mode operation. The photodiode that detects a weak signal at a single photon level at high speed by using the Geiger mode operation is the SPAD.

In addition, when the potential difference between the anode and the cathode of the photoelectric conversion unit 601 is equal to or greater than the potential difference at which the charge generated in the photoelectric conversion unit 601 causes the avalanche multiplication, and is less than or equal to the breakdown voltage, the avalanche diode operates in linear mode. The avalanche diode that performs light detection in the linear mode is called an avalanche diode (APD). In the present exemplary embodiment, the photoelectric conversion unit 601 may operate as either of the single photon avalanche diode and the avalanche diode. The potential difference that causes the avalanche multiplication will be described below.

The quench element 602 is connected between a power supply voltage portion supplying the high potential VH and the photoelectric conversion unit 601. The quench element 602 has a function of converting the change in the avalanche current generated in the photoelectric conversion unit 601 into a voltage signal. Furthermore, the quench element 602 functions as a load circuit (quench circuit) at the time of signal multiplication by the avalanche multiplication, and suppresses the voltage supplied to the photoelectric conversion unit 601 to suppress the avalanche multiplication (quench operation). As the quench element 602, for example, a resistive element or an active quench circuit that actively suppresses the avalanche multiplication by performing a feedback control based on detection of an increase in the avalanche current are used.

The pixel signal processing unit 502 includes a waveform shaping unit 603, a counter circuit 609, and a selection circuit 606. The waveform shaping unit 603 shapes a voltage change obtained at the time of detection of the photon level signal and outputs a pulse signal. An inverter circuit, for example, is used as the waveform shaping unit 603. Although an example using one inverter is shown as the waveform shaping unit 603, a circuit in which a plurality of inverters is connected in series may be used, or another circuit having the waveform shaping effect may be used.

The pulse signal output from the waveform shaping unit 603 is counted by the counter circuit 609. When the counter circuit 609 is, for example, an N-bit counter (N: positive integer), it is possible to count pulse signals of single photons up to approximately the N-th power of 2. The counted signal is held as a detected signal. When a control pulse pRES is supplied through a drive line 607, the detected signal held in the counter circuit 609 is reset.

A control pulse pSEL is supplied to the selection circuit 606 from the vertical scan circuit unit 503 illustrated in FIG. 1 via a drive line 608, and switches the electrical connection and non-connection between the counter circuit 609 and the signal line 507. For example, a transistor, a buffer circuit for outputting a signal outside of the pixel, or the like is used for the selection circuit 606.

A switch such as a transistor may be disposed between the quench element 602 and the photoelectric conversion unit 601 or between the photoelectric conversion element 501 and the pixel signal processing unit 502 to switch electrical connection. Similarly, the supply of the high potential VH to the quench element 602 or the supply of the low potential VL to the photoelectric conversion element 501 may be electrically switched using a switch such as a transistor.

In the pixel region 506 in which the plurality of pixels 500 is arranged in a matrix form, the captured image may be acquired by a rolling shutter operation in which the count of the counter circuit 609 may be sequentially reset for each row and the detected signals held in the counter circuit 609 are sequentially output for each row.

Alternatively, the captured image may be acquired by a global electronic shutter operation in which the counts of the counter circuit 609 of all the pixel rows are simultaneously reset and the detected signals held in the counter circuit 609 are sequentially output for each row. In performing the global electronic shutter operation, it is preferable to provide switching means to switch between a case of counting by the counter circuit 609 and a case of not counting. The switching means is, for example, the switch described above.

In the present exemplary embodiment, the configuration is described in which the captured image is acquired by using the counter circuit 609. However, instead of the counter circuit 609, a time-to-digital converter (hereinafter, TDC) and a memory may be used as the light detection device 1010 to acquire a pulse detection timing.

At this time, the generation timing of the pulse signal output from the waveform shaping unit 603 is converted into a digital signal by the TDC. A control pulse pREF (reference signal) is supplied to the TDC from the vertical scan circuit unit 503 of FIG. 1 via the drive line for measuring the timing of the pulse signal. The TDC acquires as a digital signal a signal when the input timing of the signal output from each pixel via the waveform shaping unit 603 is relative time with reference to the control pulse pREF.

For the TDC circuit, a delay line method of providing a delay by connecting buffer circuits in series, a looped TDC method of connecting delay lines in a loop, or the like is used. Although another method may be used, it is preferable to employ a circuit method capable of achieving a time resolution higher than or equal to the time resolution of the photoelectric conversion unit 601.

The digital signal representing the pulse detection timing obtained by the TDC is held in one or more memories. When a plurality of memories is arranged, it is possible to control the output to the signal line 507 for each memory by supplying a plurality of signals to the selection circuit 606 when the digital signal held in the memories is output to the signal line 507.

Next, the light detection device 1010 according to the present exemplary embodiment will be described with reference to FIG. 3.

The light detection device 1010 according to the present exemplary embodiment has the pixel including the avalanche diode. Among charge pairs generated in the avalanche diode, a conductivity type in which charge used as signal charge is mainly carrier charge is referred to as a first conductivity type (N type). Further, the conductivity type opposite to the first conductivity type is called a second conductivity type (P type).

FIG. 3 is a cross-sectional view schematically illustrating the avalanche diode in the present exemplary embodiment. The avalanche diode according to the present exemplary embodiment is placed in a semiconductor substrate 100. The semiconductor substrate 100 has a first surface and a second surface opposing the first surface. For example, the first surface is the front surface of the semiconductor substrate 100, and the second surface is the back surface of the semiconductor substrate 100. In the present exemplary embodiment, the depth direction is defined as from the first surface to the second surface. A gate electrode of the transistor and a multilayer wiring structure are disposed on the front side of the semiconductor substrate 100.

In a region between a separation portion 204-1 and a separation portion 204-2 in FIG. 3, a first semiconductor region 101 and a second semiconductor region 102 of the first conductivity type are disposed, and a third semiconductor region 103 of the second conductivity type and a fourth semiconductor region 104 of the second conductivity type are disposed. At this time, the third semiconductor region 103 and the fourth semiconductor region 104 have the same depth and the same impurity concentration. Typically, the third semiconductor region 103 and the fourth semiconductor region 104 are integrally formed.

The first semiconductor region 101 and the second semiconductor region 102 of the first conductivity type, and an eighth semiconductor region 203 of the second conductivity type are arranged at a first depth A indicated by a line segment AA'. The first semiconductor region 101 and the second semiconductor region 102 are in contact with each other in planar view, and the second semiconductor region 102 and the eighth semiconductor region 203 are in contact with each other in planar view. In the present exemplary embodiment, the expression "the first semiconductor region 101 and the second semiconductor region 102 are disposed at the first depth A" means that the concentration peak of the ion implanted impurity, for example, is disposed at the first depth A. However, the concentration peak is not necessarily arranged at the first depth A, and a design error and a manufacturing error are also tolerated.

A second depth B indicated by a line segment BB' is located at a position deeper than the first depth A with respect to the first surface, and the third semiconductor region 103 and the fourth semiconductor region 104 of the second conductivity type are placed. Further, an intense electric field region 150 for the avalanche multiplication is formed between the first semiconductor region 101 of the first conductivity type and the third semiconductor region 103 of the second conductivity type.

A third depth C indicated by a line segment CC" is located at a position deeper than the second depth B with respect to the first surface, and a fifth semiconductor region 105 is disposed at the third depth C. Preferably, the fifth semiconductor region 105 is of the first conductivity type.

Figure 4A:
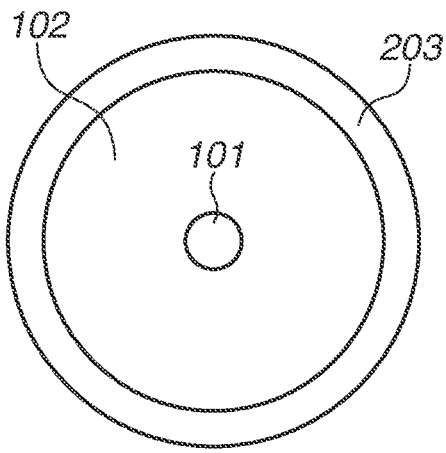
FIGS. 4A, 4B and 4C are top views of the avalanche diode.
Figure 4B:
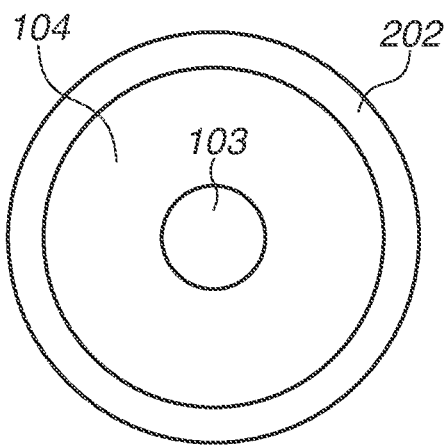
Figure 4C:
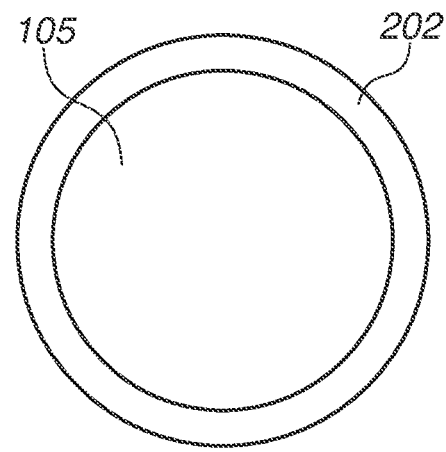

FIGS. 4A to 4C are schematic plan views of FIG. 3, FIG. 4A is a schematic plan view at the first depth A of FIG. 3, FIG. 4B is a schematic plan view at the second depth B of FIG. 3, and FIG. 4C is a schematic plan view at the third depth C of FIG. 3. While the boundaries of each semiconductor region are drawn in a circle in FIGS. 4A to 4C, the exemplary embodiments are not limited to this.

In FIG. 4A, the first semiconductor region 101 is placed in the second semiconductor region 102, and the second semiconductor region 102 is placed in the eighth semiconductor region 203. Further, the area of the second semiconductor region 102 is larger than the area of the first semiconductor region 101.

In FIG. 4B, the third semiconductor region 103 is placed in the fourth semiconductor region 104, and the fourth semiconductor region 104 is placed in a seventh semiconductor region 202. Further, the third semiconductor region 103 and the fourth semiconductor region 104 are formed at the same depth and at the same impurity concentration.

In FIG. 4C, the fifth semiconductor region 105 is placed in the P type semiconductor region 202. When FIG. 4B and FIG. 4C are overlaid, the third semiconductor region 103 and the fourth semiconductor region 104 overlap the fifth semiconductor region 105 in planar view.

Figure 5:
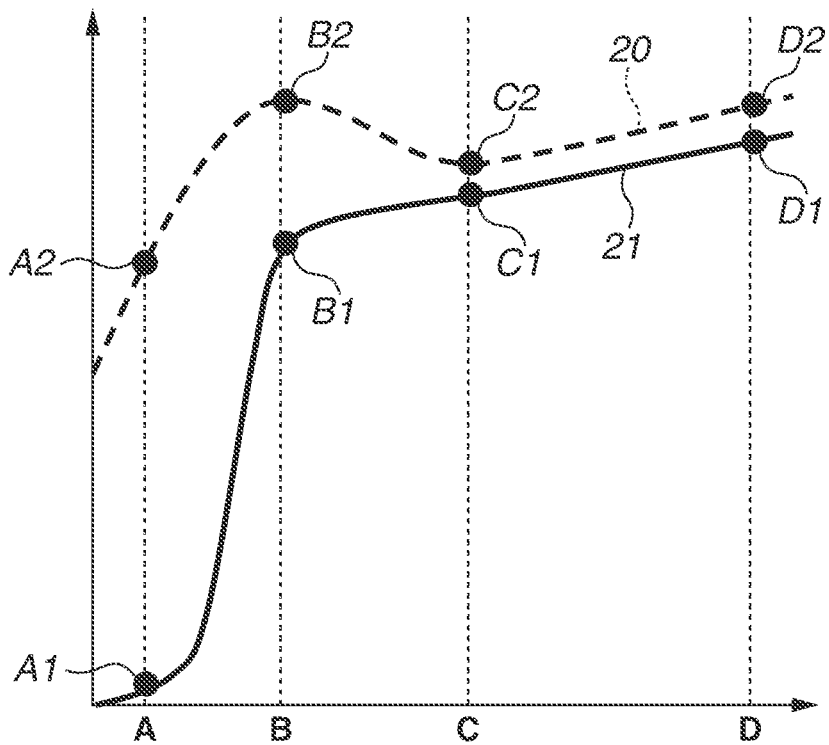
FIG. 5 is a graph illustrating potential of the avalanche diode.

FIG. 5 is a potential diagram of the avalanche diode illustrated in FIG. 3.

In FIG. 5, a dotted line 20 indicates the potential distribution of the line segment FF', and a solid line 21 indicates the potential distribution of the line segment EE' in FIG. 3. FIG. 5 illustrates the potential with reference to the electrons, which is the main carrier charge of the N type semiconductor region. When the main charge carrier is holes, the relationship between the high and low levels of the potential is reversed. Further, the depth A in FIG. 5 corresponds to the line segment AA' of FIG. 3. Similarly, the depth B corresponds to the line segment BB', the depth C corresponds to the line segment CC', and the depth D corresponds to the line segment DD', respectively.

In FIG. 5, at the depth A, the potential height of the solid line 21 is denoted by A1 and the potential height of the dotted line 20 is denoted by A2, and at the depth B, the potential height of the solid line 21 is denoted by B1 and the potential height of the dotted line 20 is denoted by B2. Further, at the depth C, the potential height of the solid line 21 is denoted by C1 and the potential height of the dotted line 20 is denoted by C2, at the depth D, the potential height of the solid line 21 is denoted by D1 and the potential height of the dotted line 20 is denoted by D2.

Referring to FIGS. 3 and 5, the potential height of the first semiconductor region 101 corresponds to A1, and the potential height of the third semiconductor region 103 corresponds to B1. Further, the potential height of the second semiconductor region 102 corresponds to A2, and the potential height of the fourth semiconductor region 104 corresponds to B2.

With respect to the dotted line 20 in FIG. 5, the potential gradually decreases from the depth D to the depth C. Then, the potential gradually increases from the depth C to the depth B, and the potential becomes the B2 level at the depth B. Then, the potential decreases from the depth B to the depth A, and becomes the level A2 at the depth A.

On the other hand, regarding the solid line 21, the potential gradually decreases from the depth D to the depth C and from the depth C to the depth B, and becomes the B1 level at the depth B. Then, the potential drops sharply from the depth B to the depth A, and becomes the A1 level at the depth A.

At the depth D, the potentials of the dotted line 20 and the solid line 21 are approximately equal to each other, and have potential gradients gradually decreasing toward the first surface side of the semiconductor substrate 100 in the regions indicated by the line segment EE' and the line segment FF. Therefore, the charge generated in the light detection device 1010 moves to the first surface side due to the gradual potential gradient.

In the present exemplary embodiment, as described above, the third semiconductor region 103 and the fourth semiconductor region 104 are formed at the same depth and at the same concentration. In the avalanche diode according to the present exemplary embodiment, the impurity concentration of the third semiconductor region 103 of the second conductivity type is lower than that of the first semiconductor region 101 of the first conductivity type, and potentials are supplied to the first and third semiconductor regions 101 and 103 so as to be reversely biased to each other. Accordingly, a depletion layer region is formed on the side of the third semiconductor region 103. With such a structure, the potential height for the first conductivity type charge, which is the signal charge, is lower in the third semiconductor region 103 than in the fourth semiconductor region 104. Accordingly, the fourth semiconductor region becomes a potential barrier for the charge photoelectrically converted in the fifth semiconductor region 105, so that the charge is likely to be collected in the third semiconductor region.

Further, due to the potential difference between the third semiconductor region 103 and the fourth semiconductor region 104, the potential becomes lower in the direction from the line segment FF to the line segment EE' at the depth C in FIG. 3. Accordingly, in the process in which the charge photoelectrically converted in the fifth semiconductor region 105 moves to the first surface of the semiconductor substrate 100, the charge is easily moved in the direction of the third semiconductor region 103.

The charge moved to the vicinity of the third semiconductor region 103 are accelerated by the steep potential gradient from the depth B to the depth A in the solid line 21 of FIG. 5, i.e., by the intense electric field, and the avalanche multiplication occurs.

On the other hand, there is a potential distribution that does not cause avalanche multiplication between the second semiconductor region 102 and the fourth semiconductor region 104 of the second conductivity type in FIG. 3, i.e., from the depth B to the depth A on the dotted line 20 in FIG. 5. Therefore, the charge generated in the fifth semiconductor region 105 can be counted as the signal charge without increasing the area of the intense electric field region 150 with respect to the photodiode size.

Further, the charge photoelectrically converted in the fourth semiconductor region 104 flows into the fifth semiconductor region 105 due to the potential gradient from the depth B to the depth C of the dotted line 20 in FIG. 5. The charge in the fifth semiconductor region 105 is easily transferred to the third semiconductor region 103 for the reason described above. Consequently, the charge photoelectrically converted in the fourth semiconductor region 104 is transferred to the first semiconductor region 101 via the third semiconductor region 103, and is detected as the signal charge by the avalanche multiplication. Therefore, the charge photoelectrically converted in the fourth semiconductor region 104 can be detected as the sensitivity.

Hereinafter, exemplary embodiments will be described in detail including value(s) of the impurity concentration. Although the configuration in which the signal charge carrier is an electron will be described here, the exemplary embodiments discussed herein are also applicable to the case where the signal charge carrier is a hole. In that case, each of the semiconductor regions and the potential relationship are reversed.

A schematic cross-sectional view and a schematic plan view of the exemplary embodiment of the present disclosure will be described with reference to FIG. 3.

In the present exemplary embodiment, to make the description easy to understand, the description will be given assuming that the first semiconductor region 101 is N type, the second semiconductor region 102 is N type, and the third semiconductor region 103 is P type, in FIG. 3. Further, the description will be given assuming that the fourth semiconductor region 104 is P type, the fifth semiconductor region 105 is N type, and a sixth semiconductor region 201, the seventh semiconductor region 202 and the eighth semiconductor region 203 are P type, respectively.

The separation portions 204-1 and 204-2 in FIG. 3 are formed by a P type semiconductor region, which is arranged in the depth direction from the first surface. More specifically, the P type semiconductor region 203 and the P type semiconductor region 202 are arranged in this order in the depth direction from the first surface, and are in contact with each other. The P type semiconductor region 202 is electrically connected to the P type semiconductor region 104 and the P type semiconductor region 201.

The impurity concentration of the P type semiconductor region 203 is higher than the impurity concentration of each of the P type semiconductor regions 202, 201 and 104. For example, the impurity concentration of the P type semiconductor region 203 is about $1 \times 10^{19}$ to $10^{20}$ [atoms/(cm$^3$)]. Note, in the present specification, the symbol of "^" represents a power. More specifically, $10^{19}$ indicates 10 to the 19th power. This allows to decrease the contact resistance by connecting the P type semiconductor region 203 and a contact plug 302, compared to the contact resistance by connecting the P type semiconductor region 202 to the contact plug 302.

The N type semiconductor region 101 is a region having a higher impurity concentration than the N type semiconductor region 105. For example, the impurity concentration of the N type semiconductor region 101 is $1 \times 10^{18}$ [atoms/(cm$^3$)] or more, and a potential that is reverse biased to the separation portion 204-1 and 204-2 is supplied to the N type semiconductor region 101.

The impurity concentration of the N type semiconductor region 102 is lower than that of the N type semiconductor region 101. For example, the impurity concentration of the N type semiconductor region 102 is about $1 \times 10^{16}$ to $5 \times 10^{17}$ [atoms/(cm$^3$)]. If the second semiconductor region 102 is P type, an avalanche multiplication electric field is formed between the first semiconductor region 101 and the second semiconductor region 102 depending on the impurity concentration of the second semiconductor region 102, and the avalanche multiplication electric field becomes a factor of noise deterioration.

The impurity concentration of the P type semiconductor region 104 is lower than the impurity concentration of the P type semiconductor region 202, and the P type semiconductor region 103 and the P type semiconductor region 104 have the same impurity concentration. For example, the impurity concentration of the P type semiconductor regions 103 and 104 is about $1 \times 10^{16}$ to $1 \times 10^{17}$ [atoms/(cm$^3$)].

A PN junction is formed between the P type semiconductor region 103 and the N type semiconductor region 101. As described above, by lowering the impurity concentration of the P type semiconductor region 103 compared to the N type semiconductor region 101, all of the P type semiconductor region 103 become the depletion layer region.

Further, the depletion layer region extends to a partial region of the N type semiconductor region 101, and the intense electric field is induced in the extended depletion layer region. The intense electric field causes the avalanche multiplication in the depletion layer region extending to the partial region of the N type semiconductor region 101, and the current based on the amplified charge is output as the signal charge through a contact plug 301.

Next, the impurity concentration of the N type semiconductor region 101, the P type semiconductor region 103, and the P type semiconductor region 104 will be described. The impurity concentration of each semiconductor region is set to an impurity concentration at which the depletion layer region does not reach a portion of the first surface of the N type semiconductor region 101, when supplying a potential difference that causes the avalanche multiplication in the depletion layer region generated in the partial portion of the N type semiconductor region 101. This is because when the depletion layer region spreads so as to be in contact with the first surface of the semiconductor substrate 100, the probability that noise due to dangling bonds or the like on the surface of the semiconductor substrate 100 is mixed into the depletion layer region from the first surface is increased.

Accordingly, the potential difference between the N type semiconductor region 101 and the separation portions 204-1 and 204-2 is set so that the electric field in the depth direction induced in the depletion layer becomes sufficiently large. In the present exemplary embodiment, the potential difference at which the electric field becomes sufficiently large is a potential difference at which the charge affected by the electric field causes the avalanche multiplication. In other words, the potential difference indicates the potential difference between the N type semiconductor region 101 and the P type semiconductor region 203 at which the light detection element of the present structure realizes the operation as the avalanche diode (APD or SPAD).

Specifically, the potential difference between the N type semiconductor region 101 and the P type semiconductor region 104 is 6 V or more. At this time, as described above, all regions of the P type semiconductor region 103 electrically connected to the P type semiconductor region 104 become the depletion layer region, and, in the depletion layer region extended to the partial region of the N type semiconductor region 101, the intense electric field is generated so that the avalanche multiplication arises.

Further, more preferably, the potential difference between the N type semiconductor region 101 and the P type semiconductor region 104 is 10 V or more and 30 V or less. At this time, for example, a potential of 10 V or more is supplied to the N type semiconductor region 101, and a potential of 0 V or less is supplied to the P type semiconductor region 203. However, when the potential difference is 6 V or more, the values of the potentials are not limited to this example.

In FIG. 3, it is assumed that the N type semiconductor region 105 having a lower impurity concentration than that of the N type semiconductor region 101 is placed immediately below the N type semiconductor region 101 having a high impurity concentration without providing the P type semiconductor regions 103 and 104. In this case, it is possible to generate the charge in the N type semiconductor region 105 and read out the charge from the N type semiconductor region 101. However, it is difficult to cause the avalanche multiplication under a voltage condition equivalent to that of the present exemplary embodiment. This is because most of the potential difference applied between the N type semiconductor region 101 and the P type semiconductor region 203 is applied to the depletion layer region of the N type semiconductor region 105, and the potential difference applied to the avalanche multiplication region near the N type semiconductor region 101 is reduced. On the other hand, in the present exemplary embodiment, because the N type semiconductor region 105 is surrounded by the P type semiconductor region in each direction, the potential in the N type semiconductor region 105 becomes a level closer to the P type semiconductor region in the periphery thereof than the N type semiconductor region 101. Thus, by suppressing the excessive spread of the depletion layer to the deep portion of the substrate by the P type semiconductor region 104, it is possible to concentrate most of the above potential difference to be applied to the avalanche multiplication region near the N type semiconductor region 101.

Accordingly, the photoelectric charge can be avalanche multiplied at a lower voltage. At this time, the impurity concentration of the N type semiconductor region 105 must be lower than the impurity concentration of the N type semiconductor region 101.

Referring to FIG. 3, an example in which the N type semiconductor region 105 has the same impurity concentration is described. However, it is preferable that the N type semiconductor region 105 has a gradient of the impurity concentration to have a potential structure so that the charge moves to the first surface side of the semiconductor substrate 100. It is possible to easily move the charge to the N type semiconductor region 101 by providing the gradient of impurity concentration.

In addition, in a case of having the gradient of the impurity concentration to be a potential structure in which the charge moves to the first surface side of the semiconductor substrate 100, in the region where the N type semiconductor region 105 is disposed, the first surface side may be a N type semiconductor region and the second surface side may be a P type semiconductor region. Alternatively, a P type semiconductor region having an impurity concentration lower than that of the P type semiconductor region 104 may be disposed instead of the N type semiconductor region 5. Even in that case, it is preferable to have the gradient of the impurity concentration so as to provide a potential structure in which the charge moves to the first surface side of the semiconductor substrate 100.

The P type semiconductor region 201 is disposed at a position deeper than the N type semiconductor region 105 and defines the depth of the photoelectric conversion region. The N type semiconductor region 105 forms PN junctions with each of the P type semiconductor regions 103, 104, 201 and 202. The impurity concentration of the P type semiconductor region 201 is higher than the impurity concentration of the P type semiconductor region 104. Thus, the charge generated in the vicinity of the P type semiconductor region 201 is likely to move toward the first surface direction.

The contact plug 301 is further connected to the N type semiconductor region 101, and the contact plug 302 is connected to the P type semiconductor region 203.

Referring to FIG. 3, the contact plug 302 has been described as being disposed on the first surface side. However, the contact plug 302 may be disposed on the second surface side.

When the contact plug 302 is disposed on the second surface side, it is preferable that the impurity concentration in a portion of the P type semiconductor region 201 where the contact plug 302 is disposed is higher than the impurity concentration of the P type semiconductor region 201. In other words, the impurity concentration is set as a semiconductor region corresponding to the P type semiconductor region 203 of the structure in which the contact plug 302 is disposed on the first surface side.

Even in a case where the separation portions 204-1 and 204-2 have an insulation separation portion on the first surface side, the contact plug 302 may be placed on the second surface side.

Next, the potential structure in the present exemplary embodiment will be described with reference to FIG. 5. Here, it is assumed that the charge carrier used as a signal is an electron.

The solid line 21 in FIG. 5 indicates the cross-sectional potential along the line segment EE' in FIG. 3. In the solid line 21, a point where the line segment AA' and the line segment EE' intersect is denoted by A1, a point where the line segment BB' and the line segment EE' intersect is denoted by B1, a point where the line segment CC' and the line segment EE' intersect is denoted by C1, and a point where the line segment DD' and the line segment EE' intersect is denoted by D1, in FIG. 3. The electrons photoelectrically converted in the N type semiconductor region 105 in FIG. 3 move along the potentials D1 to C1 and C1 to B1 in FIG. 5, and are avalanche multiplied with the steep potential gradient from B1 to A1. Then, after passing through the N type semiconductor region 101, the electrons reach the contact plug 301 and are detected as the signal charge.

The dotted line 20 in FIG. 5 indicates the cross-sectional potential along the line segment FF in FIG. 3. At the dotted line 20, a point at which the line segment AA' and the line segment FF' intersect is denoted by A2, a point at which the line segment BB' and the line segment FF' intersect is denoted by B2, a point at which the line segment CC' and the line segment FF' intersect is denoted by C2, and a point at which the line segment DD' and the line segment FF' intersect is denoted by D2, in FIG. 3. The electrons photoelectrically converted in the N type semiconductor region 105 in FIG. 3 move along the potentials D2 to C2 in FIG. 5. However, because the potential between C2 and B2 becomes a potential barrier for the electrons, the electrons cannot overcome the potential barrier. Therefore, the electrons move to the vicinity of the center indicated by the line segment EE' in the N type semiconductor region 105 in FIG. 3. Then, the electrons travel along the potential gradient C1 to B1 in FIG. 5. Then, the electrons are avalanche-multiplied by the steep potential gradient from B1 to A1, pass through the N type semiconductor region 101, reach the contact plug 301, and are detected as the signal charge.

Further, the charge generated in the vicinity of the boundary between the P type semiconductor region 104 and the N type semiconductor region 105 in FIG. 3 moves along the potential gradient from the potential B2 to the potential C2 in FIG. 5. Thereafter, as described above, the charge moves to the vicinity of the center indicated by the line segment EE' in the N type semiconductor region 105 in FIG. 3. Then, the charge is avalanche multiplied with the steep potential gradient from B1 to A1. The avalanche multiplied charge passes through the N type semiconductor region 101, reaches the contact plug 301, and then is detected as the signal charge.

In other words, with respect to the N type semiconductor region 105, a gentle potential gradient is formed from a part near the separation portions 204-1 and 204-2 toward a part far from the separation portions 204-1 and 204-2. Therefore, the charge photoelectrically converted in the N type semiconductor region 105 is finally collected in the vicinity of the potential B1 in FIG. 5.

Next, the reason why the P type semiconductor region 103 in FIG. 3 is set to the same impurity concentration as that of the P type semiconductor region 104 will be described with reference to FIGS. 6A and 6B.

Figure 6A:
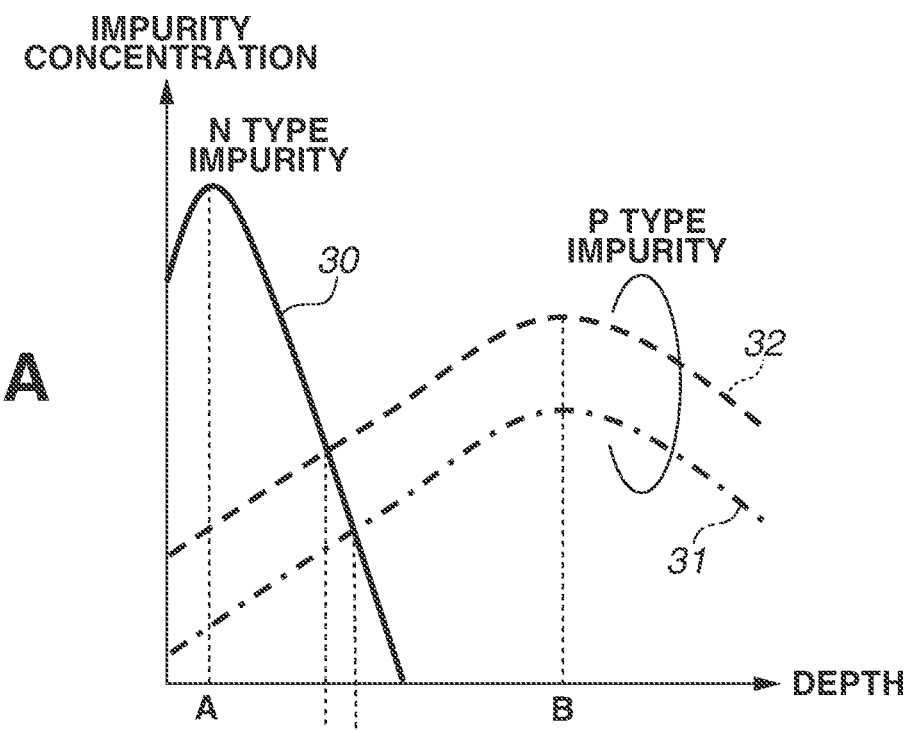
FIGS. 6A and 6B are a graph illustrating impurity concentration of the avalanche diode and a graph illustrating electric field strength of the avalanche diode, respectively.

FIG. 6A illustrates an impurity concentration distribution in the depth direction starting from the first surface of the semiconductor substrate 100 along the line segment EE' of FIG. 3. In FIG. 6A, the impurity concentration distribution 30 illustrates the peak of the N type impurity concentration distribution at the depth A, and the impurity concentration distributions 31 and 32 illustrate the peak of the P type impurity concentration distribution at the depth B. Further, a point where the N type impurity is intersected with the P type impurity is a PN junction portion.

In the present exemplary embodiment, the depth A in FIG. 6A is a point at which the line segments AA' and EE in FIG.

3 intersect, and the depth B is a point at which the line segments BB' and EE' in FIG. 3 intersect.

Further, in FIG. 6A, the P type impurity concentration distributions 31 and 32 represent the difference in P type impurity concentration. The lower peak concentration is represented by the P type impurity concentration distribution 31 and the higher peak concentration is represented by the P type impurity concentration distribution 32.

The P type impurity concentration distribution 32 illustrates a case where the P type semiconductor region 104 and P type semiconductor region 103 in FIG. 3 have the same impurity concentration. On the other hand, the P type impurity concentration distribution 31 illustrates a case where the P type impurity concentration in the region serving as the flow path of the signal charge is lower than the P type impurity concentration in the periphery region.

Figure 6B:
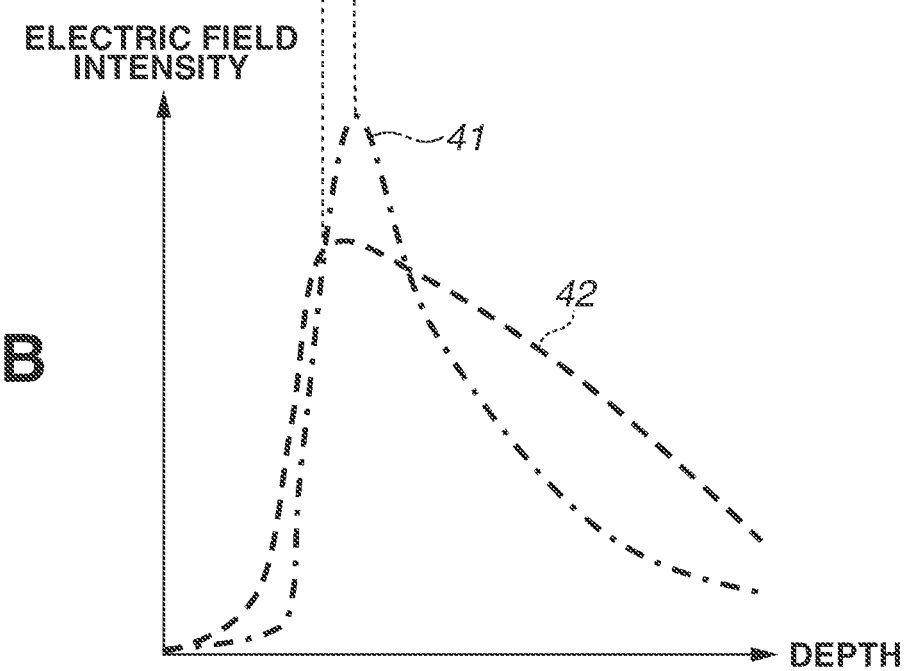

FIG. 6B illustrates an electric field intensity distribution when the same depth as FIG. 6A is illustrated on the horizontal axis.

In FIG. 6B, the electric field intensity distribution 41 illustrates a case where the P type impurity concentration distribution of FIG. 6A is the P type impurity concentration distribution 31, and the electric field intensity distribution 42 illustrates a case where the P type impurity concentration distribution of FIG. 6A is the P type impurity concentration distribution 32.

In the case of the P type impurity concentration distribution 31 in FIG. 6A, the concentration of the lower doped side of the PN junction is lower than that in the case of the P type impurity concentration distribution 32. Therefore, in order to obtain the intense electric field necessary for the avalanche multiplication, it is necessary to set the applied voltage higher. When the applied voltage is increased, a local intense electric field region is formed as illustrated in the electric field intensity distribution 41 in FIG. 6B, and causes the noise deterioration.

On the other hand, in the case of the P type impurity concentration distribution is the P type impurity concentration distribution 32, the concentration of the lower doped side of the PN junction is higher than that in the case of the P type impurity concentration distribution 31. Therefore, the applied voltage for obtaining the intense electric field necessary for the avalanche multiplication can be lower than that in the above case. When the applied voltage is lowered, as illustrated in the electric field intensity distribution 42 in FIG. 6B, the local intense electric field region is less likely to be formed as compared with the electric field intensity distribution 41, and thus noise can be suppressed.

Next, a method of manufacturing the avalanche diode illustrated in FIG. 3 will be described with reference to FIGS. 7A to 7F. The order may be changed as appropriate for the steps which is not described with respect to the order. Further, it is possible to apply a well-known manufacturing method to the process that are not described in FIGS. 7A to 7F.

Figure 7A:
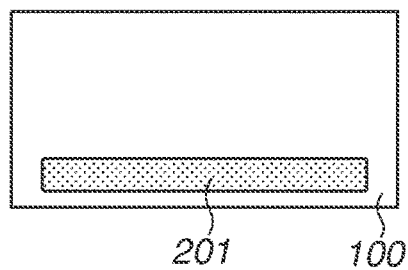
FIGS. 7A to 7F are diagrams illustrating a method of manufacturing the avalanche diode.

As illustrated in FIG. 7A, an impurity (e.g., boron) is ion-implanted into a region to be the P type semiconductor region 201 from the normal line direction to the first surface of the semiconductor substrate 100. Accordingly, the P type semiconductor region 201 is formed at a deep position relative to the first surface of the semiconductor substrate 100.

Figure 7D:
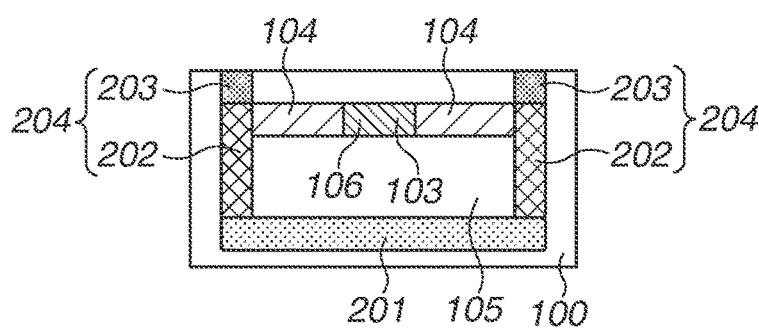
Figure 7B:
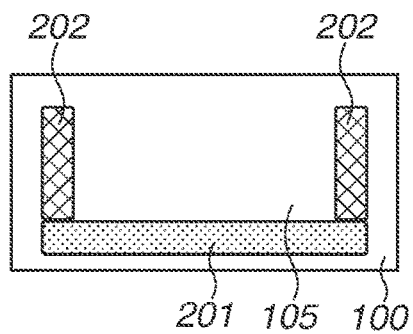

Next, as illustrated in FIG. 7B, an impurity (e.g., boron) is ion-implanted from the normal line direction to the first surface of the semiconductor substrate 100. Accordingly, the P type semiconductor region 202 is formed at a position shallower than the P type semiconductor region 201. At this time, the P type semiconductor region 202 is formed so that a part of the P type semiconductor region 202 and a part of the P type semiconductor region 201 are connected to each other. Further, the P type semiconductor region 202 is formed so that the impurity concentration of the P type semiconductor region 201 is higher than that of the P type semiconductor region 202.

Figure 7E:
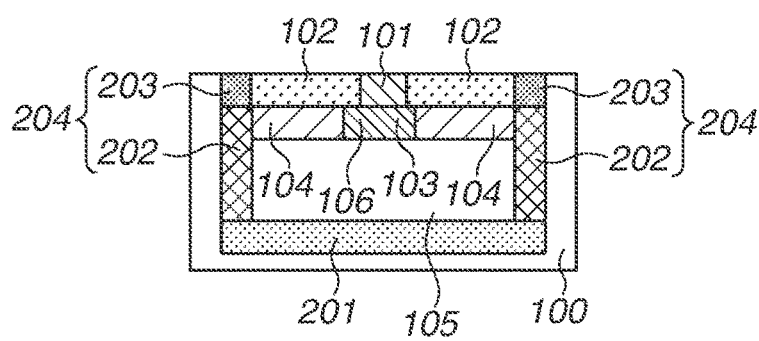
Figure 7C:
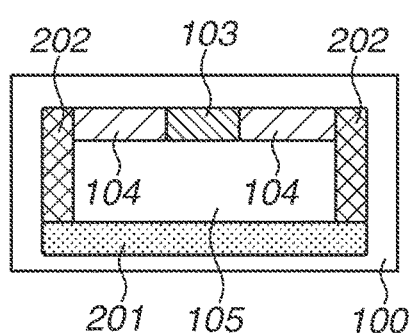

Next, as illustrated in FIG. 7C, an impurity (e.g., phosphorus or arsenic) is ion-implanted from the normal line direction to the first surface of the semiconductor substrate 100 to form the N type semiconductor region 105. In addition, the P type semiconductor regions 104 and 103 are formed by ion implantation of an impurity (e.g., boron) from the normal line direction to the first surface of the semiconductor substrate 100. At this time, the N type semiconductor region 105 is formed at a position deeper than the P type semiconductor regions 103 and 104. Further, since the P type semiconductor regions 103 and 104 are formed with the same depth and the same impurity concentration, the P type semiconductor regions 103 and 104 can be formed by using the same photomask pattern.

Next, as illustrated in FIG. 7D, P type ion implantation is performed in the normal line direction to the first surface of the semiconductor substrate 100 to form the P type semiconductor region 203. At this time, the P type semiconductor region 203 is formed to be shallower than the P type semiconductor region 202 and a part of the P type semiconductor region 203 is connected to the P type semiconductor region 202.

Next, as illustrated in FIG. 7E, N type ion implantation is performed in the normal line direction to the first surface of the semiconductor substrate 100 to form the N type semiconductor regions 101 and 102. At this time, the N type semiconductor region 101 is formed at a position shallower than the P type semiconductor region 103, and the N type semiconductor region 102 is formed at a position shallower than the P type semiconductor region 104.

Figure 7F:
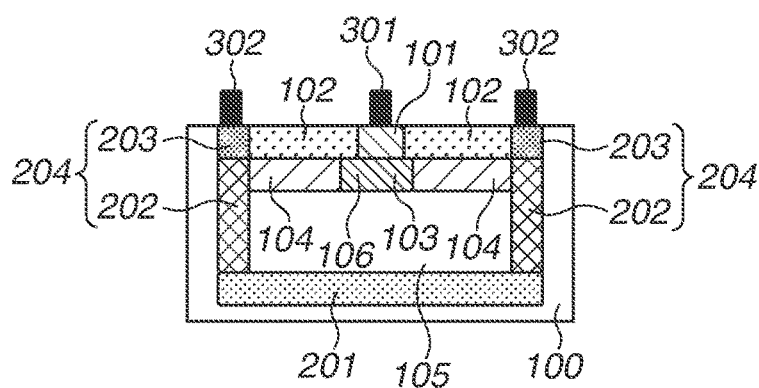

Next, as illustrated in FIG. 7F, the contact plug 301 is disposed so as to be in contact with the N type semiconductor region 101, and the contact plug 302 is disposed so as to be in contact with the P type semiconductor region 203. The signal charge detected by the avalanche multiplication is transferred to a photon counting processing circuit through the contact plug 301.

In the light detection device 1010 according to the present exemplary embodiment, the P type semiconductor regions 103 and 104 have the same depth and the same impurity concentration. The avalanche multiplication in the present exemplary embodiment arises by the voltage difference between the N type semiconductor region 101 and the P type semiconductor region 104. If the concentration of the P type semiconductor region 103 is lower than the concentration of the P type semiconductor region 104, the relative positions of the N type semiconductor region 101 and the P type semiconductor region 104 may be misaligned due to manufacturing errors or the like. In this case, the voltage difference between the N type semiconductor region 101 and the P type semiconductor region 104 is changed, so that the avalanche multiplication is weakened or strengthened. Accordingly, the accuracy of the signal of the pixel 500 is reduced.

However, as in the case of the present exemplary embodiment, when the P type semiconductor regions 103 and 104 are at the same depth and at the same concentration, the relative displacement to the N type semiconductor region 101 is less likely to occur. Therefore, the voltage difference between the N type semiconductor region 101 and the P type semiconductor regions 103 and 104 does not easily fluctuate. Accordingly, the light detection device 1010 according to the present exemplary embodiment has an effect of suppressing the decrease in the signal accuracy of the pixel 500.

The light detection device 1010 described in the present exemplary embodiment can be applied to either the surface irradiation type in which light is incident from the first surface or the back surface irradiation type in which light is incident from the second surface.

In a second exemplary embodiment, an example of a light detection system using the light detection device 1010 of each exemplary embodiment will be described. An invisible light detection system as an example of the light detection system and a medical diagnostic system such as positron emission tomography (PET) system will be described with reference to FIG. 8.

The pixel 500 according to the second exemplary embodiment has a TDC and a memory instead of the counter circuit 609 illustrated in FIG. 2. Here, a description is given assuming that the TDC is referred to as a TDC 204, and the memory is referred to as a memory 205.

Figure 8:
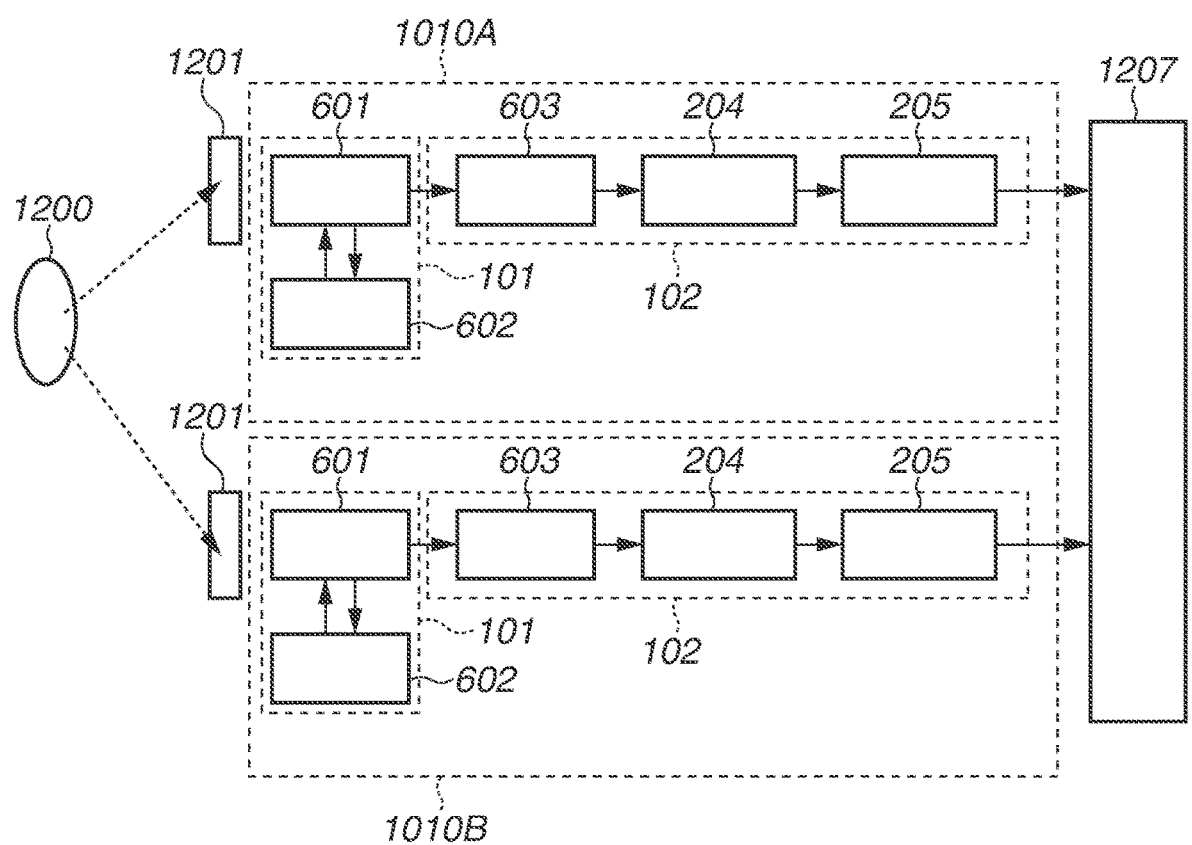
FIG. 8 is a block diagram illustrating a configuration of a photoelectric conversion system.

FIG. 8 is a block diagram illustrating a configuration of an invisible light detection system. The invisible light detection system includes a wavelength conversion unit 1201, a data processing unit 1207, and a plurality of light detection devices 1010 (i.e., light detection devices 1010A and 1010B).

An irradiation object 1200 outputs light in a wavelength band of invisible light. Each of the wavelength conversion units 1201 receives light in a wavelength band of invisible light output from the irradiation object 1200, and emits visible light.

The visible light emitted from each wavelength conversion unit 1201 is incident on the photoelectric conversion unit 601, and the photoelectric conversion unit 601 photoelectrically converts the incident visible light. Then, the light detection devices 1010 each hold, in the memory 205, a digital signal of the signal generated based on the photoelectrically converted charge, through the quench element 602, the waveform shaping unit 603, and the TDC 204. The plurality of light detection devices 1010 may be formed as one device or may be formed by arranging a plurality of devices.

The plurality of digital signals held in the memories 205 of the plurality of light detection devices 1010 is subjected to signal processing by the data processing unit 1207. The data processing unit 1207 as a signal processing means performs a synthesis process of a plurality of images obtained from a plurality of digital signals.

Next, a description will be given of a structure of a medical diagnostic system such as PET system as a specific example of the invisible light detection system.

A subject who is the irradiation object 1200 outputs a radiation pair from inside the living organism. Each of the wavelength conversion units 1201 constitutes a scintillator, and the scintillator emits visible light when the radiation output from the subject is incident on the scintillator.

Each of the photoelectric conversion units 601 irradiated with the visible light emitted from the scintillator performs photoelectric conversion of the visible light, and each of the light detection devices 1010 holds the digital signal of the signal generated based on the electric charge subjected to the photoelectric conversion in the memory 205, through the quench element 602, the waveform shaping unit 603 and the TDC 204. In other words, each of the light detection devices 1010 is arranged to detect the arrival time of the radiation output from the subject, and detects the visible light irradiated from the scintillator, and holds the digital signal in the memory 205.

The digital signals held in the memories 205 of the plurality of light detection devices 1010 are processed by the data processing unit 1207. The data processing unit 1207, as the signal processing means, performs a synthesis process such as image reconstruction using a plurality of images obtained from the plurality of digital signals to form an image of inside the living organism of the subject.

In a third exemplary embodiment, an example of a light detection system using the light detection device 1010 of each exemplary embodiment will be described.

Referring to FIG. 9, a distance detection system, which is an example of the light detection system, will be described. The pixel 500 according to the third exemplary embodiment has the TDC and the memory described in the first exemplary embodiment in place of the counter circuit 609 illustrated in FIG. 2. Here, a description will be given assuming that the TDC will be referred to as the TDC 204 instead of the counter circuit 609, and the memory will be referred to as the memory 205.

An example of a block diagram of the distance detection system according to the third exemplary embodiment will be described with reference to FIG. 9. The distance detection system includes a light source control unit 1301, a light emission unit 1302, an optical member 1303, a light detection device 1010, and a distance calculation unit 1309.

The light source control unit 1301 controls driving of the light emission unit 1302. When the light emission unit 1302 receives a signal from the light source control unit 1301, the light emission unit 1302 emits light of short pulses (pulse train) with respect to the imaging direction.

The light emitted from the light emission unit 1302 is reflected by a subject 1304. The reflected light is received by the photoelectric conversion unit 601 of the light detection device 1010 through the optical member 1303, and a signal based on the photoelectrically converted electric charge is inputted to the TDC 204 via the waveform shaping unit 603.

The TDC 204 compares the signal obtained from the light source control unit 1301 with the signal input from the waveform shaping unit 603. Then, the time required to receive the reflected light reflected from the subject 1304 after the light emission unit 1302 emits the pulsed light is highly accurately converted to a digital signal. The digital signal output from the TDC 204 is held in the memory 205.

The distance calculation unit 1309 calculates the distance from the light detection device 1010 to the subject based on the digital signal of a plurality of times of measurement held in the memory 205. The distance detection system can be used, for example, for a vehicle.

Figure 10A:
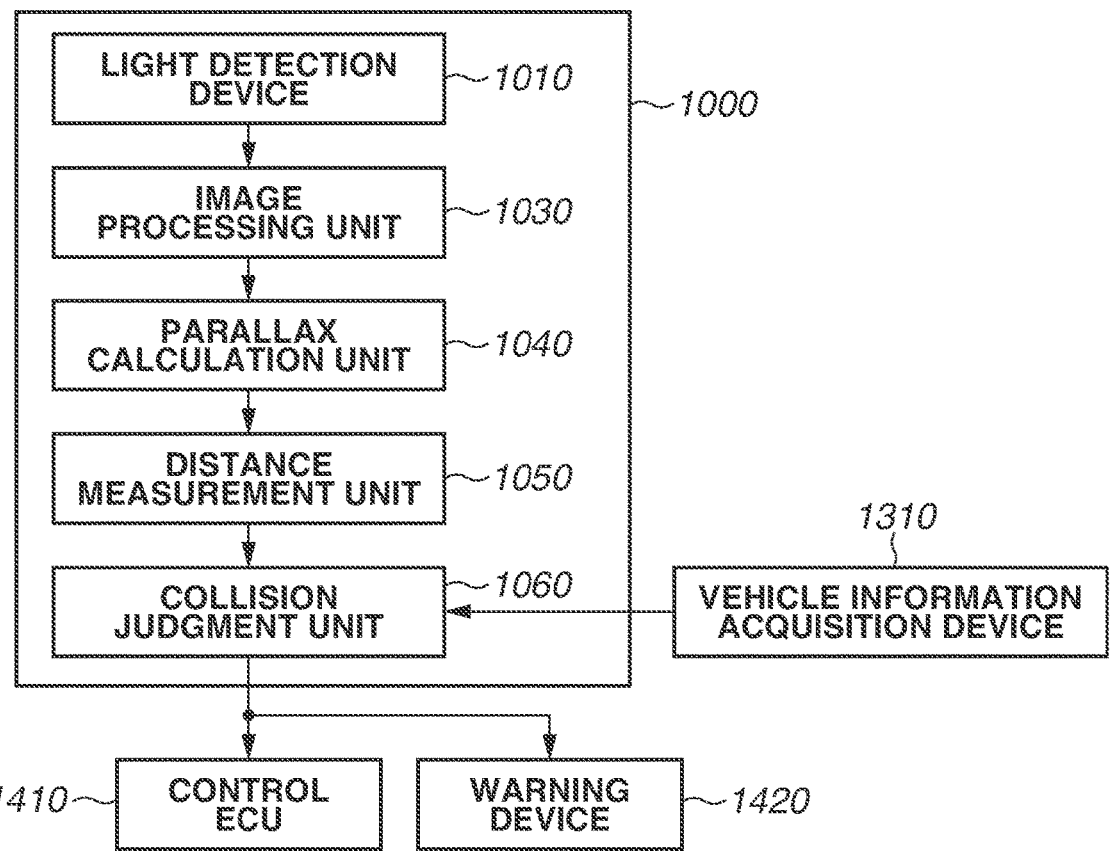
FIGS. 10A and 10B are block diagrams illustrating a configuration of a mobile object.
Figure 10B:
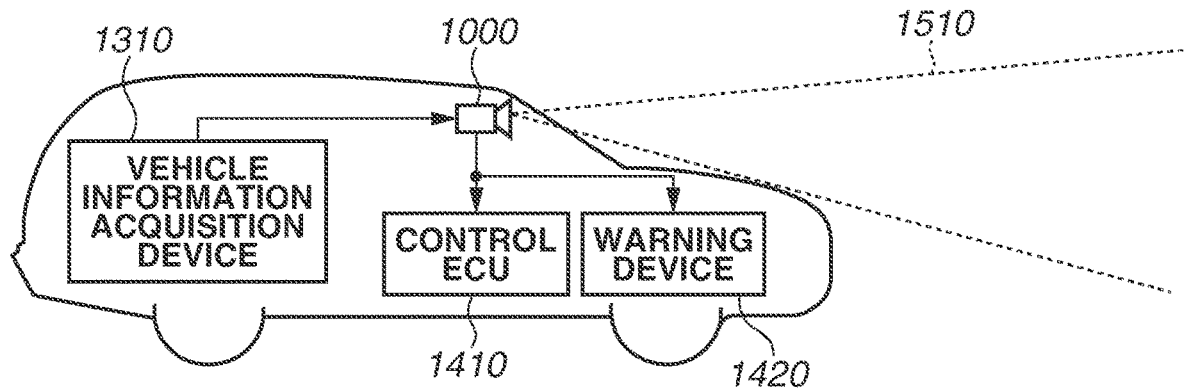

Next, FIGS. 10A and 10B illustrates an example of a light detection system in a case where the counter circuit 609 in FIG. 2 is used. In FIGS. 10A and 10B, a description will be given of a light detection system for an in-vehicle camera, which is an example of the light detection system.

The light detection system 1000 is a light detection system including ranging pixels and imaging pixels according to the present exemplary embodiment. The light detection system 1000 has an image processing unit 5030 for performing image processing on a plurality of digital signals acquired by the light detection device 1010. Further, the light detection system 1000 has a parallax calculation unit 5040 for calculating parallax (phase difference of parallax image) from a plurality of image acquired by the image processing unit 1030.

The light detection system 1000 further includes a distance measurement unit 1050 for calculating a distance to an object based on the calculated parallax amount, and a collision judgement unit 1060 for determining whether there is a possibility of collision based on the calculated distance. In the present exemplary embodiment, the parallax calculation unit 1040 and the distance measurement unit 1050 are an example of distance information acquisition means for acquiring distance information relating to the distance to the object. The distance information is information relating to the parallax, the defocus amount, the distance to the object, and the like.

The collision judgement unit 1060 may use any of the parallax amount, the defocus amount, the distance to the object, and the like to determine the probability of collision. The distance information acquisition means may be implemented by hardware designed exclusively, by software module, or by the combination thereof. Further, the distance information acquisition means may be implemented by a field programmable gate array (FPGA), an application specific integrated circuit (ASIC) or the like. It may also be implemented by any combinations of the items.

The light detection system 1000 is connected to a vehicle information acquisition device 1310 and can acquire vehicle information such as a vehicle speed, a yaw rate and a steering angle. The light detection system 1000 is further connected to a control electronic control unit (ECU) 1410 which is a control device for outputting a control signal for generating a braking force to the vehicle based on the determination result of the collision judgement unit 1060.

The light detection system 1000 is further connected to a warning device 1420 that issues an alert to the driver based on the determination result of the collision judgement unit 1060. For example, when the possibility of collision is high as the determination result of the collision judgement unit 1060, the control ECU 1410 performs vehicle control for avoiding the collision and reducing a damage by applying a brake, returning an accelerator, suppressing an engine output or the like. The warning device 1420 provides to the user a warning by sounding a warning, displaying warning information on a screen of a car navigation system, and vibrating a seat belt or a steering.

In the present exemplary embodiment, the light detection system 1000 captures the surrounding images of the vehicle, for example, the front or the rear of the vehicle. FIG. 10B illustrates the light detection system 1000 when the front of the vehicle is imaged. The control to avoid collision with another vehicle has been described above. However, the light detection system is also usable for a control for automatic driving to follow another vehicle, a control for automatic driving to avoid driving out of the lane, and the like. Further, the usage of the light detection system 1000 is not limited to a vehicle such as a personal transportation vehicle, and the light detection system 1000 may be used for, for example, a moving body (moving device) such as a ship, an aircraft, and an industrial robot. In addition, the usage of the light detection system 1000 is not limited to a moving body, but can include an apparatus that uses object recognition such as an Intelligent Transport System (ITS).

The present exemplary embodiment provides the light detection device with reduced noise and the photoelectric conversion system.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A manufacturing method for manufacturing a light detection device including a plurality of pixels each including an avalanche diode, the manufacturing method comprising:
   forming a first semiconductor region of a first conductivity type at a first depth by injecting an impurity into a semiconductor substrate including a first surface and a second surface opposing the first surface;
   forming a second semiconductor region of a second conductivity type at a second depth deeper than the first depth with respect to the first surface by injecting an impurity into the semiconductor substrate;
   forming a third semiconductor region of the first conductivity type at a third depth deeper than the second depth with respect to the first surface by injecting an impurity into the semiconductor substrate; and
   forming a first separation region and a second separation region which are of the second conductivity type and are configured to separate one pixel from another pixel of the plurality of pixels by injecting an impurity into the semiconductor substrate,
   wherein in cross sectional view, the second semiconductor region is arranged to extend from the first separation region to the second separation region,
   wherein the first semiconductor region, the second semiconductor region, and the third semiconductor region are overlapped one another in planar view, and
   wherein after each of the first semiconductor region, the second semiconductor region, and the third semiconductor region is formed, the second semiconductor region is arranged to extend continuously from the first separation region to the second separation region, and entire the second semiconductor region at the second depth is the second conductivity type and has the same impurity concentration.

2. The manufacturing method according to claim 1, wherein the second semiconductor region is formed after the first separation region and the second separation region are formed.

3. The manufacturing method according to claim 1, wherein the first separation region and the second separation region are connected to a contact plug to which a predetermined potential is applied.

4. The manufacturing method according to claim 3, wherein the first semiconductor region is connected to a second contact plug to which a second predetermined potential is applied.

5. The manufacturing method according to claim 4, further comprising forming a fifth semiconductor region of the second conductivity type at a fourth depth deeper than the third depth with respect to the first surface by injecting an impurity into the semiconductor substrate.

6. The manufacturing method according to claim 5, wherein the fifth semiconductor region is configured to be electronically connected to the first separation region and the second separation region.

7. The manufacturing method according to claim 5, wherein an impurity concentration of the fifth semiconductor region is higher than an impurity concentration of the second semiconductor region.

8. The manufacturing method according to claim 1, further comprising forming a fourth semiconductor region of the first conductivity type at the first depth by injecting an impurity into the semiconductor substrate, wherein an impurity concentration of the fourth semiconductor region of the first conductivity type is lower than an impurity concentration of the first semiconductor region and the fourth semiconductor region of the first conductivity type is in contact with the first semiconductor region at the first depth.

9. The manufacturing method according to claim 1, further comprising forming a fifth semiconductor region of the second conductivity type at a fourth depth deeper than the third depth with respect to the first surface by injecting an impurity into the semiconductor substrate.

10. The manufacturing method according to claim 9, wherein the fifth semiconductor region is configured to be electronically connected to the first separation region and the second separation region.

11. The manufacturing method according to claim 10, wherein the fifth semiconductor region is configured to be electronically connected to the second semiconductor region.

12. The manufacturing method according to claim 11, wherein the third semiconductor region extends continuously from the first separation region to the second separation region.

13. The manufacturing method according to claim 11, wherein in plan view, an area of the second semiconductor region is larger than an area of the first semiconductor region.

14. The manufacturing method according to claim 11, wherein in plan view, an area of the third semiconductor region is larger than an area of the first semiconductor region.

15. The manufacturing method according to claim 11, wherein in plan view, an area of the second semiconductor region and an area of the third semiconductor region are larger than an area of the first semiconductor region.

16. The manufacturing method according to claim 11, wherein the second surface is a light incident surface.

17. The manufacturing method according to claim 9, wherein an impurity concentration of the fifth semiconductor region is higher than an impurity concentration of the second semiconductor region.

18. A light detection system comprising:
   a light detection device manufactured by the manufacturing method according to claim 1; and
   a circuit configured to process a signal from the light detection device.

19. The light detection system according to claim 18, wherein the light detection system includes a distance detection system.

20. The manufacturing method according to claim 1, wherein the third semiconductor region extends continuously from the first separation region to the second separation region.

21. The manufacturing method according to claim 1, wherein in plan view, an area of the second semiconductor region is larger than an area of the first semiconductor region.

22. The manufacturing method according to claim 1, wherein in plan view, an area of the third semiconductor region is larger than an area of the first semiconductor region.

23. The manufacturing method according to claim 1, wherein in plan view, an area of the second semiconductor region and an area of the third semiconductor region are larger than an area of the first semiconductor region.

24. The manufacturing method according to claim 1, wherein the second surface is a light incident surface.

* * * * *